United States Patent
Wong et al.

(10) Patent No.: US 9,234,930 B2
(45) Date of Patent: Jan. 12, 2016

(54) DETERMINATION OF PHYSICAL CONNECTIVITY STATUS OF DEVICES BASED ON ELECTRICAL MEASUREMENT

(75) Inventors: Jason Wong, Saratoga, CA (US); Gyudong Kim, Sunnyvale, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 909 days.

(21) Appl. No.: 13/021,958

(22) Filed: Feb. 7, 2011

(65) Prior Publication Data

US 2011/0193579 A1 Aug. 11, 2011

Related U.S. Application Data (60) Provisional application No. 61/303,248, filed on Feb. 10, 2010.

(51) Int. Cl.
| | |
|---|---|
| *G06F 13/36* | (2006.01) |
| *G01R 31/02* | (2006.01) |
| *G06F 11/34* | (2006.01) |
| *G06F 11/30* | (2006.01) |

(52) U.S. Cl.
CPC .......... *G01R 31/021* (2013.01); *G06F 11/3055* (2013.01); *G06F 11/349* (2013.01); *G06F 11/3485* (2013.01)
USPC .................................. 710/18; 710/32; 710/12

(58) Field of Classification Search
CPC .............. G01R 31/021; G06F 11/3055; G06F 11/3485; G06F 11/349
See application file for complete search history.

(56) References Cited

U.S. PATENT DOCUMENTS

| | | | |
|---|---|---|---|
| 6,313,584 B1 | 11/2001 | Johnson et al. | |
| 6,850,252 B1 | 2/2005 | Hoffberg | |
| 7,313,680 B2 * | 12/2007 | Kyle et al. | ........................ 713/1 |
| 7,337,081 B1 | 2/2008 | Kagan | |

(Continued)

FOREIGN PATENT DOCUMENTS

| | | |
|---|---|---|
| CN | 101516009 A | 8/2009 |
| CN | 101601291 A | 12/2009 |

(Continued)

OTHER PUBLICATIONS

International Search Report and Written Opinion for PCT Patent Application No. PCT/US2011/024171 Mailed Oct. 24, 2011, 11 pages.

(Continued)

*Primary Examiner* — Henry Tsai
*Assistant Examiner* — Cheng-Yuan Tseng
(74) *Attorney, Agent, or Firm* — Fenwick & West LLP (57) ABSTRACT

Embodiments of the invention are generally directed to determination of physical connectivity status of devices based on electrical measurement. An embodiment of a method includes discovering a connection of a first device with a second device, and performing an electrical measurement of the second device by the first device via the connection between the first device and the second device, where performing the electrical measurement includes sensing by the first device of an element of the second device. The method further includes, if the sensing by the first device fails to detect the element of the second device and a predetermined condition for the electrical measurement is enabled, then determining by the first device that the connection with the second device has been lost.

15 Claims, 9 Drawing Sheets

(56) References Cited

U.S. PATENT DOCUMENTS

| | | | |
|---|---|---|---|
| 7,603,486 B2 * | 10/2009 | Le et al. | 710/7 |
| 7,836,239 B2 * | 11/2010 | Duval et al. | 710/305 |
| 7,921,311 B2 * | 4/2011 | Ciaffi et al. | 713/300 |
| 7,975,088 B2 * | 7/2011 | Yoshida et al. | 710/302 |
| 8,185,669 B2 * | 5/2012 | Oh | 710/8 |
| 8,188,615 B2 * | 5/2012 | Du et al. | 307/2 |
| 8,230,118 B2 * | 7/2012 | Toba et al. | 710/5 |
| 8,478,914 B2 * | 7/2013 | Sato et al. | 710/68 |
| 2005/0259948 A1 | 11/2005 | Ando | |
| 2009/0156051 A1 * | 6/2009 | Doyle et al. | 439/489 |
| 2009/0160491 A1 | 6/2009 | Ochiai et al. | |
| 2009/0177818 A1 | 7/2009 | Shim et al. | |
| 2009/0204989 A1 | 8/2009 | White et al. | |
| 2009/0210591 A1 | 8/2009 | Tsai | |
| 2010/0026790 A1 | 2/2010 | Ohba et al. | |
| 2010/0026908 A1 * | 2/2010 | Lin | 348/744 |
| 2010/0085482 A1 | 4/2010 | Toba et al. | |
| 2010/0231795 A1 | 9/2010 | Choi | |

FOREIGN PATENT DOCUMENTS

| | | |
|---|---|---|
| JP | 02-291682 A | 12/1990 |
| JP | 2005-234943 A | 9/2005 |
| JP | 2007-059345 A | 3/2007 |
| JP | 2007-272376 A | 10/2007 |
| JP | 2009-157536 A | 7/2009 |
| JP | 2011-514694 A | 5/2011 |
| WO | WO 99/14699 A1 | 3/1999 |
| WO | WO 2009/066607 A1 | 5/2009 |
| WO | WO 2009/088656 A1 | 7/2009 |

OTHER PUBLICATIONS

"High-Definition Multimedia Interface, Specification Version 1.3," HDMI Licensing, LLC, Jun. 22, 2006, 237 pages.

Chinese First Office Action, Chinese Application No. 201180008515.0, Apr. 17, 2014, 18 pages.

Japanese Office Action, Japanese Application No. 2012-552943, Dec. 2, 2014, 6 pages (with English Summary).

Chinese Office Action, Chinese Application No. 201180008515.0, Jan. 5, 2015, 17 pages.

Chinese Third Office Action, Chinese Application No. 201180008515.0, Jul. 1, 2015, 11 pages.

European Extended Search Report, European Application No. 11742728.6, Jul. 8, 2015, 6 pages.

United States Office Action, U.S. Appl. No. 14/559,523, Oct. 23, 2015, 26 pages.

* cited by examiner

FIG. 1

| Condition<br>CBUS Connected Status<br>in Measuring Device<br>205 | | |
|---|---|---|
| Attached Devices<br>Termination<br>210 | Don't Care | Terminated |
| Measuring Device<br>Valid Period<br>215 | Not Valid | Valid |
| Physical Cable<br>Status<br>220 | Disconnected | Connected | Disconnected |
| Measuring Device<br>RSEN<br>225 | Ignore | TRUE | FALSE |

DETERMINATION OF PHYSICAL CONNECTIVITY STATUS OF DEVICES BASED ON ELECTRICAL MEASUREMENT

RELATED APPLICATIONS

This application is related to and claims priority to U.S. Provisional Patent Application No. 61/303,248, filed Feb. 10, 2010, and such application is incorporated herein by reference.

TECHNICAL FIELD

Embodiments of the invention generally relate to the field of electronic devices and, more particularly, to determination of physical connectivity status of devices based on electrical measurement.

BACKGROUND

For the purpose of data communications, two or more electrical devices may be interconnected. For example, a first device (such as a device operating as a source device to provide data) may be attached with a second device (such as a device operating as a sink device to receive the data from the source device), where the connection may be via a cable or similar interface. The devices may utilize various different protocols. In such a system, the devices may exchange data while the devices are connected, with the data being transferred via the cable.

However, the two or more devices may become disconnected, such as by the physical disconnection of the cable. While the devices may eventually determine that there is a disconnection via a communication protocol, this commonly will result in a delay, with one or more of the devices continuing to attempt communication with the other device until the disconnection is determined via the protocol for the devices.

BRIEF DESCRIPTION OF THE DRAWINGS

Embodiments of the invention are illustrated by way of example, and not by way of limitation, in the figures of the accompanying drawings in which like reference numerals refer to similar elements.

SUMMARY

Embodiments of the invention are generally directed to determination of physical connectivity status of devices based on electrical measurement.

In a first aspect of the invention, a method includes discovering a connection of a first device with a second device, and performing an electrical measurement of the second device by the first device via the connection between the first device and the second device, where performing the electrical measurement includes sensing by the first device of an element of the second device. If the sensing by the first fails to detect the element of the second device and a predetermined condition for the electrical measurement is enabled, then the first device determines that the connection with the second device has been lost.

In a second aspect of the invention, an apparatus includes an interface for a connection with a second apparatus, the apparatus being operable to discover the second apparatus, and a reference-sensing element to perform an electrical measurement on a common node of the interface with the second apparatus to detect an element of the second apparatus, where the apparatus is to determine that connectivity with the second apparatus is lost when the reference-sensing element fails to detect the element of the second apparatus.

DETAILED DESCRIPTION

Embodiments of the invention are generally directed to determination of physical connectivity status of devices based on electrical measurement.

In some embodiments, an apparatus, system, and process are provided to detect the disconnection of a second apparatus from a first apparatus using electrical measurement. In some embodiments, an apparatus, system, and process are provided to detect the disconnection of any of a plurality of apparatuses from a first apparatus. While embodiments may include any number of apparatuses, for simplicity this description will generally refer to a first apparatus and a second apparatus that are connected together.

When a first apparatus, such as a Source apparatus, determines that it is disconnected from a previously connected second apparatus, such as a Sink apparatus, the first apparatus may take appropriate action, such as ceasing transmission, changing to a lower power state, or other such action. However, detection of the disconnection of the first apparatus from the second apparatus using a particular protocol for the apparatuses will generally result in delay in responding to the disconnection, and, in addition to other effects, may result in unnecessary power consumption by the first apparatus as it continues to attempt communications with a disconnected device.

In some embodiments, a process, apparatus, or system may utilize electrical measurement to detect and monitor the connection and disconnection of apparatuses. In some embodiments, process, apparatus, or system may utilize a condition for electrical measurement. In some embodiments, the condition may provide a time period or periods during which a change in the electrical measurement will indicate a loss in a physical connection.

In some embodiments, a reference-sensing process (RSEN) is used in a device (the "measuring device") to provide measurements to determine whether connections to one or more devices that have been attached to the measuring device (the "attached device(s)") have been terminated. In some embodiments, the results of the measurement are used to interpret the physical connectivity between devices. Embodiments are not limited to any particular number of devices, and are applicable to one or multiple measuring devices and one or multiple attached devices.

In some embodiments, the valid usage of RSEN is limited to the status of a condition. In some embodiments, the condition is a condition provided by a communication protocol. Until the condition is present (True), a status of the RSEN is ignored. In some embodiments, the use of the condition allows for flexibility with regard to whether attached devices termination control (which may be ON or OFF) is present at the moment that physical contact is made to the measuring device. Further, the condition allows for application of embodiments in various different protocols.

Embodiments are not limited to connections using any particular protocol. In an example, a first apparatus and a second apparatus may utilize HDMI™ (High-Definition Multimedia Interface) protocol or MHL™ (Mobile High-Definition Link) protocol, where HDMI and MHL provide audio/video interfaces for transmitting digital data. HDMI may be described by the provisions of HDMI specifications, including "High-Definition Multimedia Interface", Version 1.4, released May 28, 2009. MHL may be described by the provisions of MHL specifications, including "Mobile High-Definition Link", Version 1.0, released Jun. 30, 2010. In one example, a condition for an MHL connection may be a time period during which a termination element is provided on a control bus (CBUS), the termination being a pull down or pull up device.

In some embodiments, when a condition is active, and thus a valid period for determination of RSEN status exists, then, if the physical connectivity between devices is lost, RSEN will reflect this status. In some embodiments, a measuring element will communicate this fact to the device or controller. In some embodiments, the device then addresses the disconnection without relying on additional methods to determine the physical status.

In some embodiments, a process may be applied to multiple measuring devices or attached devices, such as multiple terminations and measuring apparatuses connected to a common node. The common node may be, for example, a pair of differential nodes to enhance common mode noise immunity, such as immunity to supply noise.

In some embodiments, an electrical measurement includes a measurement to determine the existence of a termination resistance in an attached device. However, the termination resistance may not be in place until a discovery process is completed. In some embodiments, a condition is present for the termination according to the respective protocol. In an example, a pull up impedance termination for an MHL CBUS link is connected when device discovery is completed. In some embodiments, the electrical measurement of the termination is active during a time period when the discovery process is completed, and thus the termination should be in place for the link between devices.

In some embodiments, in order to measure the presence of a termination, it may not be necessary to force any voltage or current to the common node, and hence a passive electrical measurement method and apparatus may be used. For example, the connection of two devices may be monitored using a passive electrical measurement method and apparatus.

In some embodiments, in order to measure the presence of multiple attached devices and the number of the attached devices, an active apparatus and method may be utilized. In a particular embodiment, a measuring device may force a fixed amount of current into a common node for measurement. In some embodiments, the current may be an amount of current that does not exceed the noise margin of other digital input buffers that could also be attached in other measuring devices on the same common node when the measuring device is connected to an attached device.

In some embodiments, each electrical measurement may commence with a passive measurement. Once the presence of at least one attached device is detected, each measuring device could start another measurement. In some embodiments, because multiple attached devices will lower the termination impedance, the communications, if any, will not be affected by the passive measurement.

In some embodiments, for measuring devices, including measuring devices engaged in passive detection, a bleeding resistor (either system-wide or distributed to each measuring device) is provided to limit the maximum detection time related to parasitic capacitance and leakage current.

In some embodiments, an arbitration process may be provided for measuring devices because communications can start while a measurement is being performed, or multiple measuring devices can try to measure at overlapped periods.

In some embodiments, an embodiment of the detection of device detection may be utilized between any electrical devices, including, but not limited to, consumer electronics devices (such as display devices), mobile devices (such as cell phones, cameras, and camcorders), and personal computing devices (including desktop computers, laptop computers, net-top devices, netbooks, and tablets).

Figure 1:
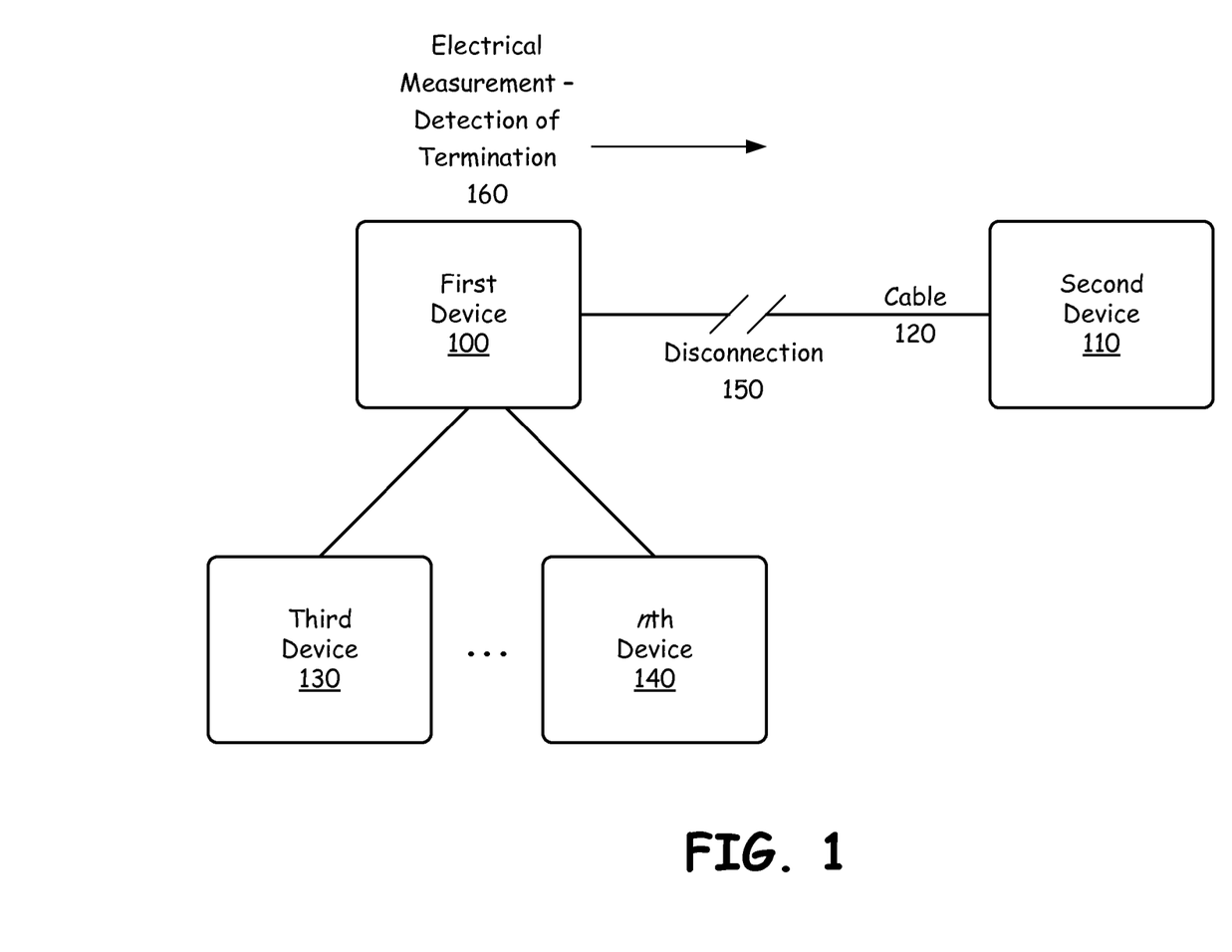
FIG. 1 is an illustration of the detection of a disconnection between devices utilizing an embodiment of a detection apparatus or process.

FIG. 1 is an illustration of the detection of a disconnection between devices utilizing an embodiment of a detection apparatus or process. In this illustration, a first device 100 may be attached to one or more devices, such as second device 110, as well as a third device 130 through an nth device 140. In some embodiments, a cable 120 or element connects the first and second devices. In some embodiment, the first device 100 utilizes an electrical measurement process 160 to detect a disconnection 150 from the second device 110.

In some embodiments, the first device 100 may detect a termination in the second device 110 during a time period when a condition is effective. If the termination is not detected when the condition is effective, the first device 100 may determine that the connection with the second device 110 has been lost, and take appropriate action. In some embodiments, the termination becomes effective after a discovery process when the connection between the first device 100 and the second device 110 is discovered, the condition being effective after the discovery process is concluded.

Figure 2:
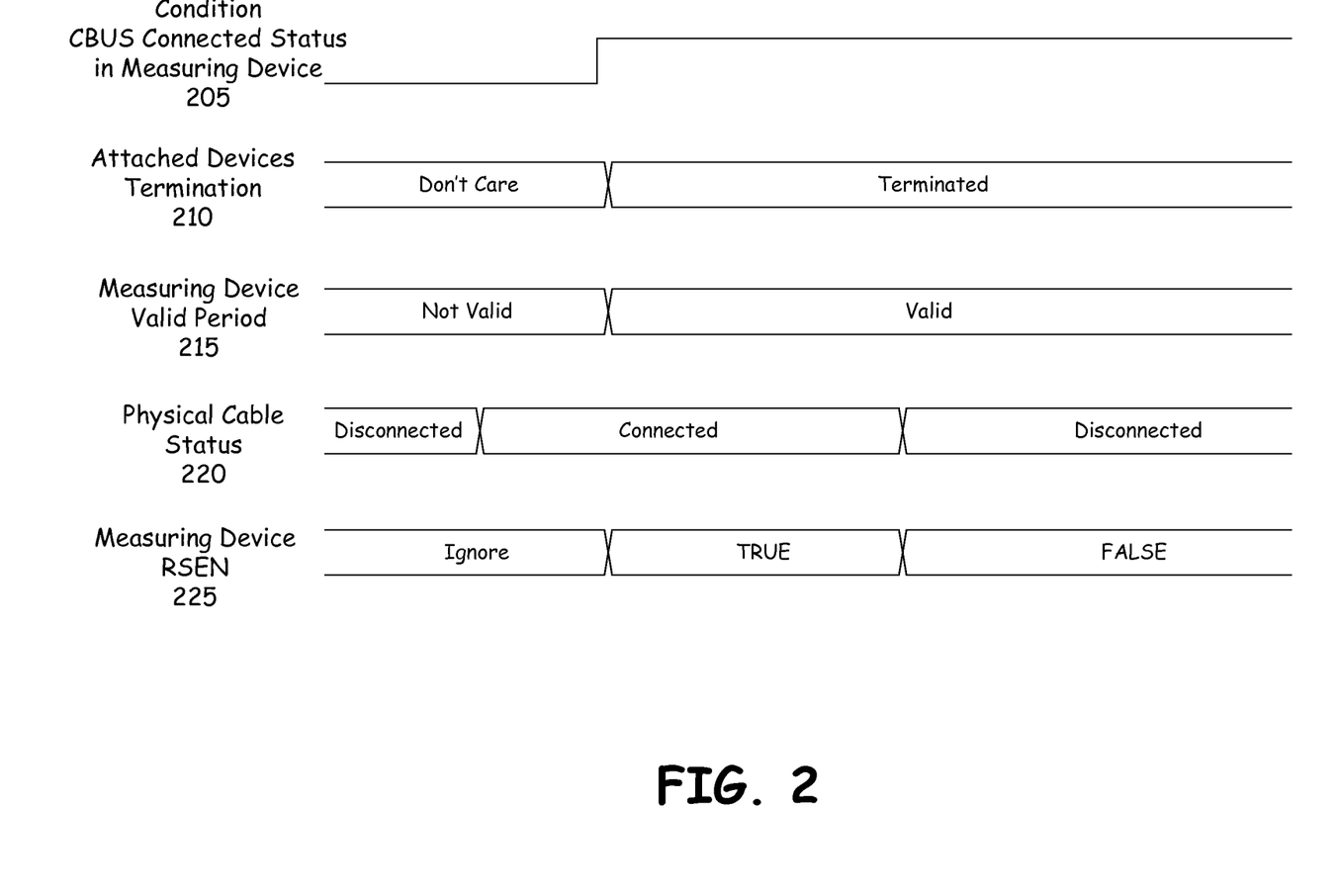
FIG. 2 is timing diagram to illustrate an embodiment of the detection of the disconnection of an apparatus.

FIG. 2 is timing diagram to illustrate an embodiment of the detection of the disconnection of an apparatus. In some embodiments, a condition (such as a control bus CBUS connected status in a measuring device 205) becomes effective at a point in time. Prior to such point in time a termination of an attached device 210 is not relevant (Don't Care), and after this point the attached device will have a termination element (such as pull-up or pull-down resistance) in place (Terminated). In some embodiments, a measuring device valid period 215 will be Not Valid prior to the effective time of the termination, and becomes Valid after this effective time.

In some embodiments, a physical cable status 220 may initially be Disconnected, but a measuring device or element (Reference-Sensing—RSEN) 225 will Ignore this during the Not Valid measuring device period. In this illustration, the cable status 220 then becomes Connected followed by the CBUS connected status 205 becoming effective. The attached device termination 210 is connected (Terminated) and the measuring device period 215 becomes Valid, and thus the RSEN value 225 measuring the existence of the termination becomes TRUE.

However, the cable between the measuring device and the attached device may thereafter become disconnected, which thus occurs during the Valid measuring period 215. In some embodiments, the disconnection of the termination results in the measuring device RSEN value 225 then becoming FALSE, thus resulting in detection of the loss of connection with the attached device.

Figure 3:
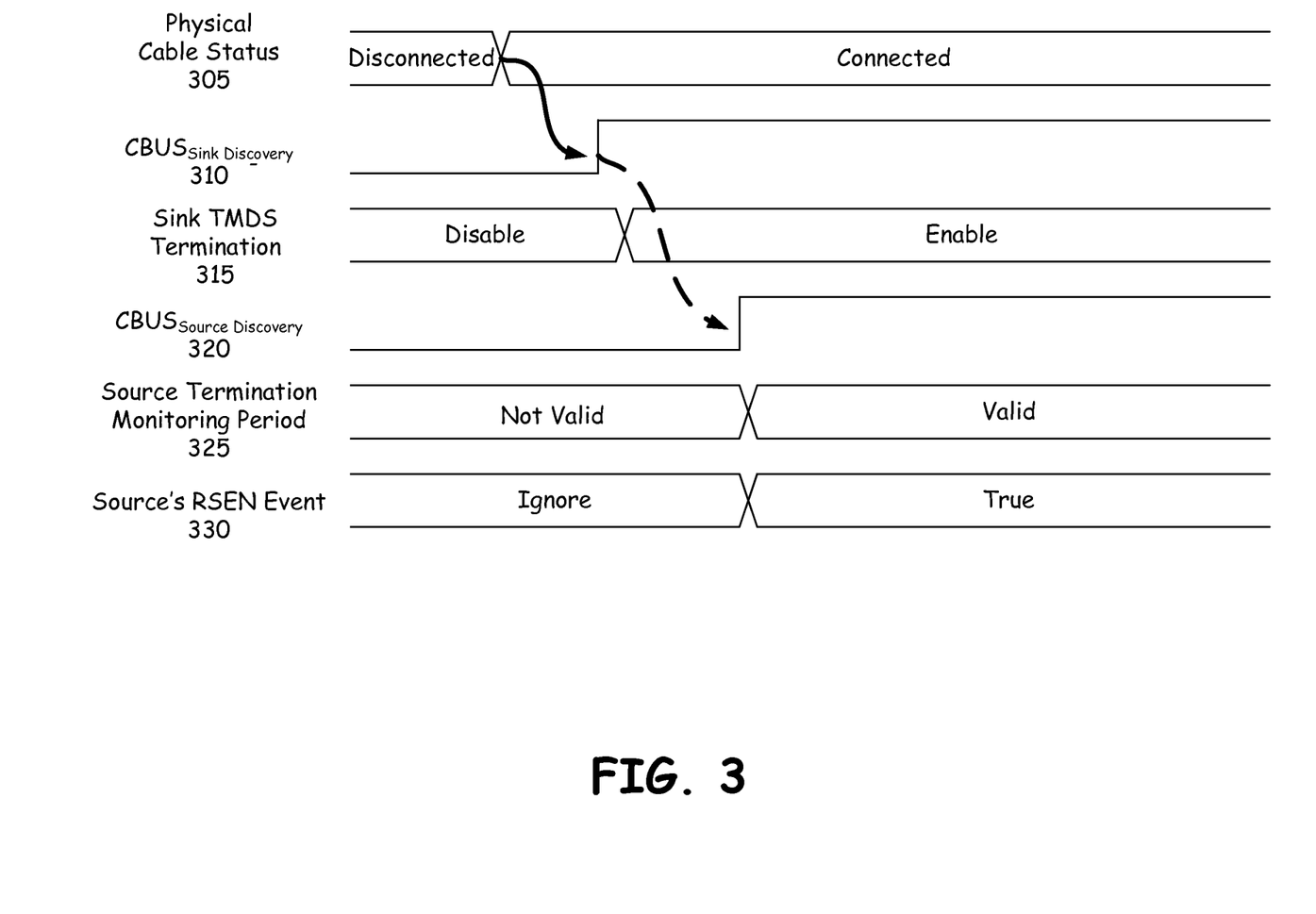
FIG. 3 is a timing diagram to illustrate an embodiment of a process for establishing a state for detection of disconnection of an apparatus in an example system.

FIG. 3 is a timing diagram to illustrate an embodiment of a process for establishing a state for detection of disconnection of an apparatus in an example system. In this example, a Source device, such as an MHL™ (Mobile High-definition Link) compatible device, may be connected to another device, the other device being a Sink device receiving data from the Source device. As illustrated, a physical cable status 305 is initially Disconnected, and then becomes Connected, indicating that a cable connection between the Source device and the Sink device is connected. In this illustration, a CBUS Sink device discovery process 310 is then completed, indicating that the Sink device has discovered the connection of the Sink device with the Source device utilizing the CBUS, resulting in an Enable status for a Sink TMDS (Transition Minimized Differential Signaling) termination 315 (the termination device is enabled). As shown in FIG. 3, this is followed by completion of a CBUS Source discovery process 320 by which the MHL Source device discovers the connection with the Sink device, which is indicated as the process 320 being enabled.

In some embodiments, the completion of the Source discovery process then results in the relevant condition becoming effective, the relevant condition being the enablement of a termination resistance in the discovered Sink device. In some embodiments, a Source termination monitoring period 325 then becomes Valid. As illustrated, the physical cable is connected, and the Source's RSEN event 330, which was Ignored, then becomes True. In some embodiments, the enablement of detection of an RSEN event puts a system in a state for detection of a loss of connection based on the electrical measurement of the termination resistance.

Figure 4:
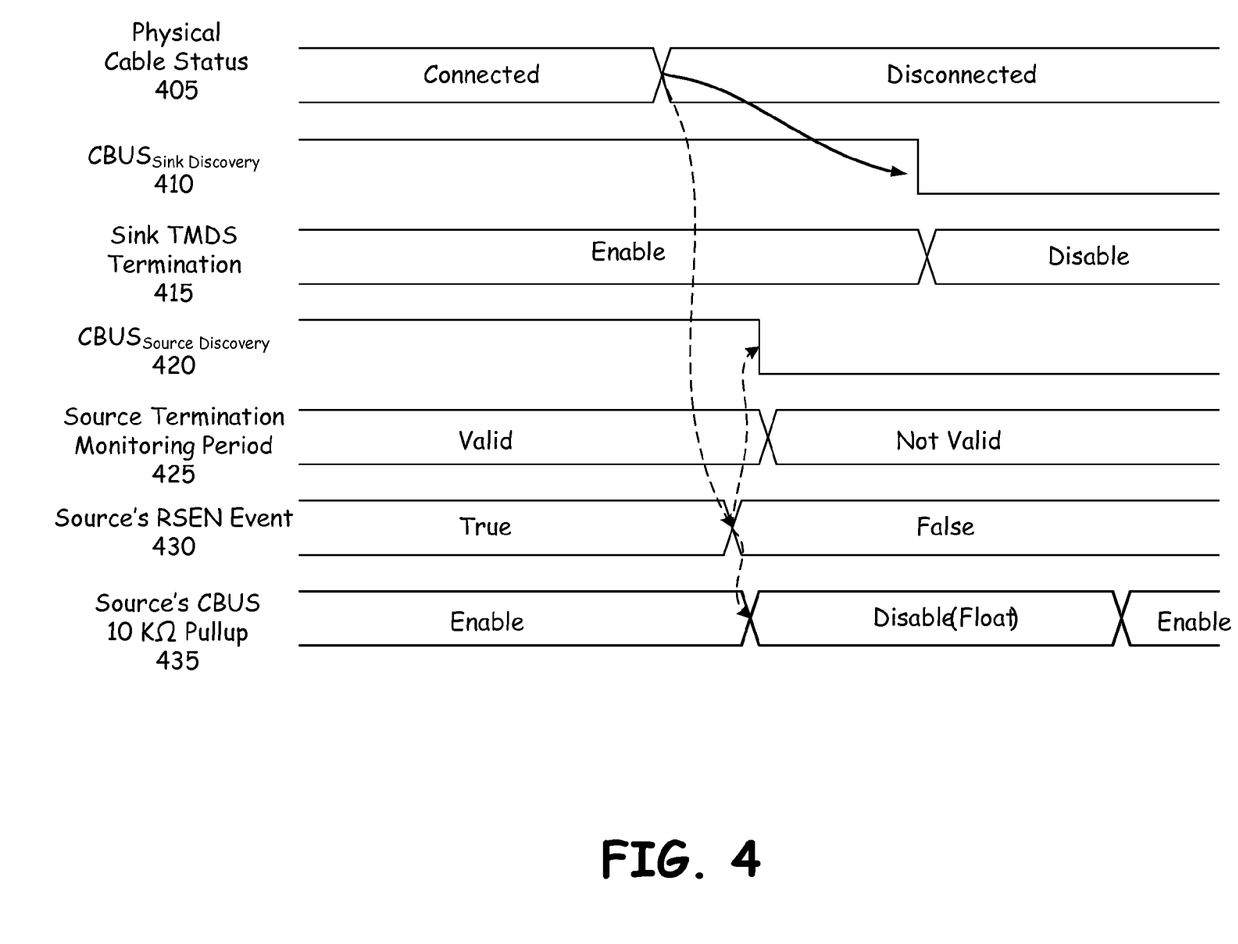
FIG. 4 is a timing diagram to illustrate an embodiment of a process for detection of the disconnection of an apparatus in an example system.

FIG. 4 is a timing diagram to illustrate an embodiment of a process for detection of the disconnection of an apparatus in an example system. In this example, a Source is initially connected as shown by physical cable status 405, with CBUS Sink discovery 410 and Source discovery 420 being completed, such as, for example, the state following the enablement of the termination resistance of a discovered Sink device in FIG. 3. As illustrated in FIG. 4, the Sink's termination is enabled 415, the termination monitoring period 425 is Valid, the RSEN event is true 430, and the Source's own pullup device on the CBUS is enabled 435.

However, in this illustration the physical cable becomes disconnected. In some embodiments, the disconnection results in the RSEN event 430 becoming False because the termination for the Sink is no longer detected. In some embodiments, the False RSEN status results in disabling the Source discovery status 420, and in the Source disabling (including floating) the pull up device on the CBUS 435. Thus, the Source has been enabled to quickly determine and address the disconnection. Subsequently the Sink discovery status 410 may be disabled as the Sink determines that the connection is no longer in place, resulting in the Sink's termination 415 being disabled. In some embodiments, after a period of time the Source's pullup resistance may be re-enabled, thus putting the Source in a condition for discovery of connection of the cable.

Figure 5:
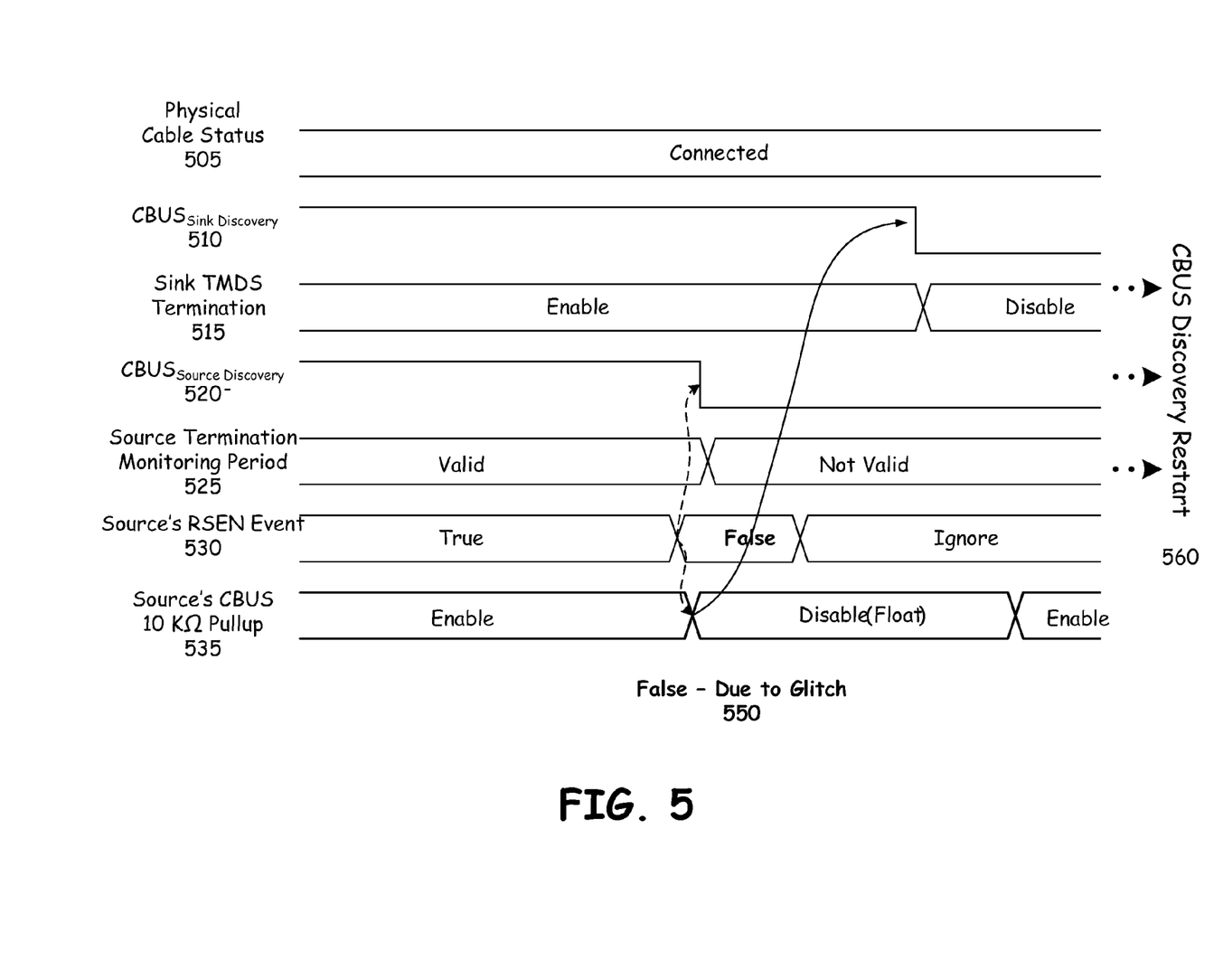
FIG. 5 is a timing diagram to illustrate an embodiment of a process for handling an erroneous indication of disconnection of devices.

FIG. 5 is a timing diagram to illustrate an embodiment of a process for handling an erroneous indication of disconnection of devices. In this illustration, a physical cable is connected between a Source apparatus 505 and a Sink apparatus. However, an erroneous reference-sensing event may result from a glitch 550, where the cable actually remains connected between the Source apparatus and the Sink. In this illustration, CBUS Sink discovery 510 and Source discovery 520 are completed, the Sink TMDS termination is enabled 515, the Source termination monitoring period 525 is valid, and the Source's termination resistance (CBUS pullup device) 535 is enabled.

However, in this example the Source's RSEN event 530 may change from True to False due to a glitch in sensing or device operation. In some embodiments, in response to the False status for the RSEN event 530, the Source apparatus determines that the connection has been lost, resulting in the Source pullup device 535 being disabled and the Source termination monitoring period 525 becoming Not Valid. In some embodiments, this occurrence is followed by the RSEN event 530 changing to an Ignore state such that the status of RSEN is not an issue. In response to the disabling of the Source pullup device, the normal operation of the Sink device will result in the discovery of the Source 510 to be ended, with the Sink termination 515 then being disabled. In some embodiments, the Source's pull up device 535 may be enabled after elapse of a certain time, allowing the system to recover and be set for a CBUS discovery restart 560.

Figure 6:
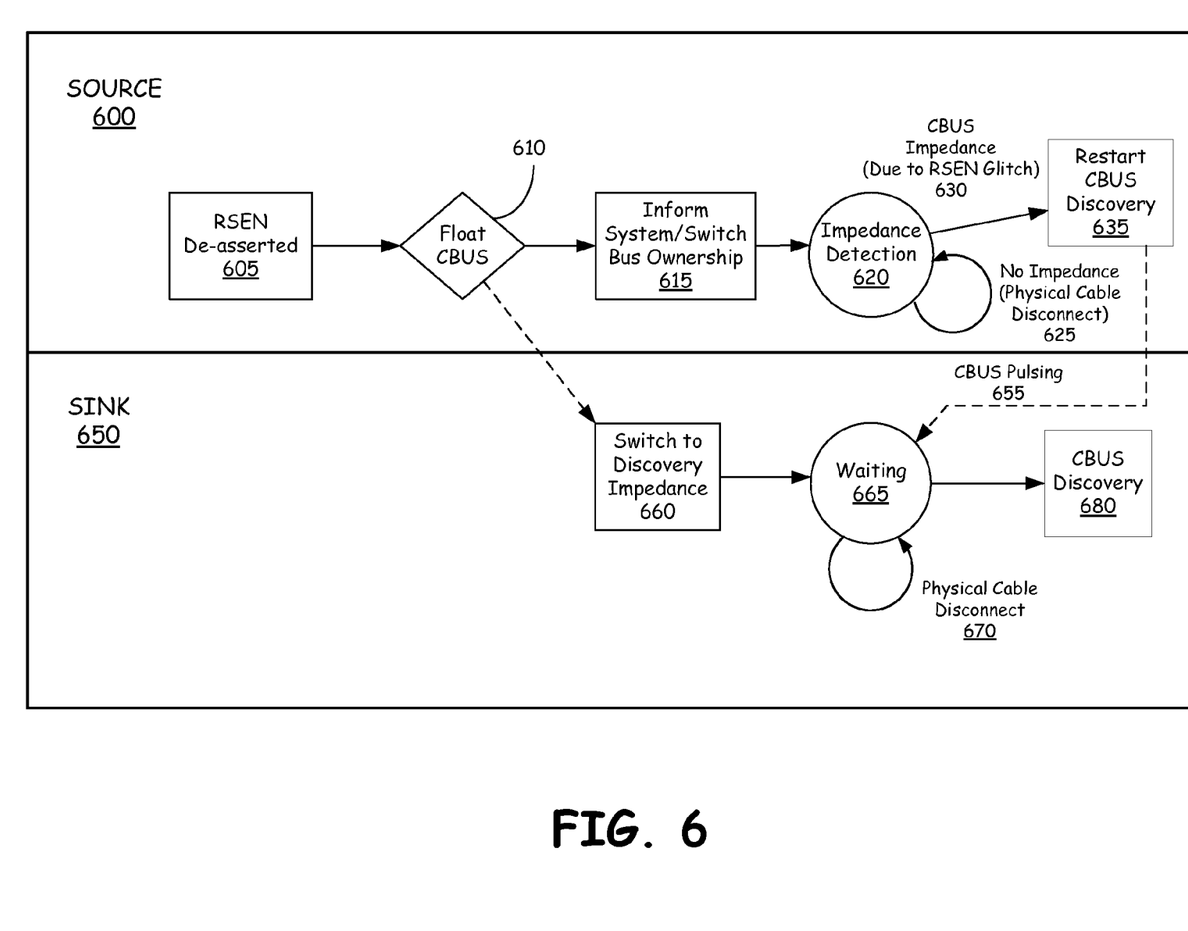
FIG. 6 is a state diagram to illustrate an embodiment of a process for system recovery after a determination that an apparatus is disconnected.

FIG. 6 is state diagram to illustrate an embodiment of a process for system recovery after a determination that an apparatus is disconnected. In this illustration, a Source 600 is attached to a Sink 650. In some embodiments, a disconnection or glitch has resulted in de-assertion of sensing by the Source 605. When the RSEN status for the Source 600 is de-asserted, the CBUS is disabled (floated) 610. In some embodiments, the Source 600 then may inform a relevant system or switch regarding the change in bus ownership 615, while the Sink 650 removes the termination and switches to discovery impedance 660. The Source then proceeds with impedance detection 620, while the Sink proceeds with waiting for a CBUS pulse from the Source 665. If the cable is disconnected and remains disconnected, the cable status for the Source remains Disconnected 625 because the CBUS impedance is not detected. Further, the Sink remains in the waiting state 665 while the physical cable remains disconnected 670.

In some embodiments, upon detecting an impedance of the CBUS 630 (such as in circumstances in which a glitch has occurred and the cable remains connected), the Source restarts the CBUS discovery process 635. In accordance with a discovery process for the Source, the Source takes appropriate action, such as pulsing the CBUS 655, thus resulting in the Sink transferring from the waiting status to the CBUS discovery state 680.

Figure 7:
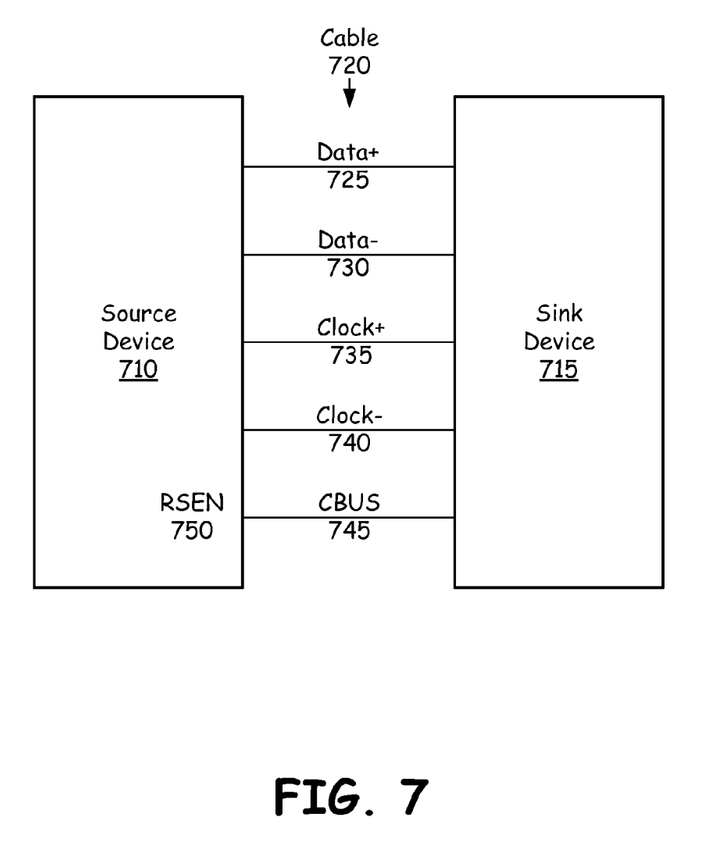
FIG. 7 is an illustration of an embodiment of a process and apparatus to detect disconnection of an apparatus.

FIG. 7 is an illustration of an embodiment of a process and apparatus to detect disconnection of an apparatus. In this particular example, a Source device 710 is attached to a Sink device 715 via a connection, such as an MHL connection via cable 720, with the interface including data lines 725-730, clock lines 735-740, and a control bus (CBUS) 745. FIG. 7 provides an example of a connection, but embodiments are not limited to any particular connection or interface. While FIG. 7 illustrates clock elements 735-740 in order to show the inclusion of a clock signal, such illustration is not intended to be limited to separate physical wires for such clock signal, and includes transmission of a common mode clock signal that is embedded under the data lanes on lines 725-730. In some embodiments, the Source 710 may utilize the CBUS 745 as a common node for detection of an element of the Sink 715 utilizing an RSEN element 750, wherein the process may be, for example, as illustrated in the timing diagrams provided as FIGS. 2-6.

In this illustration, the Source 710 and Sink 715 may discover the connection via the cable 720. Upon completing the discovery process, the Sink 715 may enable a termination resistance on CBUS 745. In some embodiments, the Source 710 may provide sensing of the termination via the CBUS after the discovery of the connection with the Sink 715. In some embodiments, upon the cable 720 becoming disconnected, RSEN 750 operates to detect that the termination resistance of Sink 715 is no longer connected via the CBUS. In some embodiments, the detection that the Sink termination resistance is no longer connected may be utilized to determine that the connection between Source 710 and Sink 715 has been lost.

Figure 8:
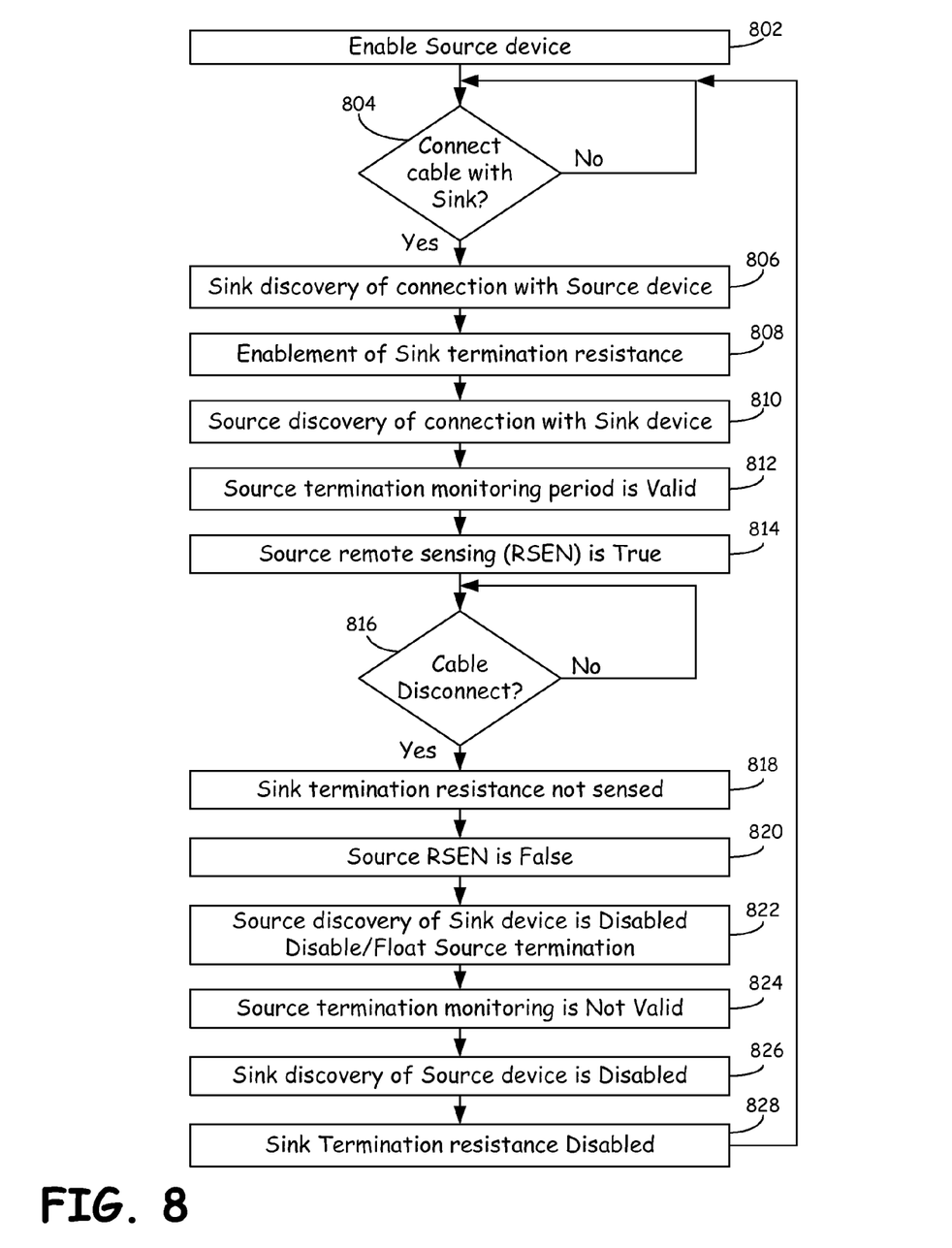
FIG. 8 is a flowchart to illustrate an embodiment of a process for detecting a loss of connectivity between devices.

FIG. 8 is a flowchart to illustrate an embodiment of a process for detecting a loss of connectivity between devices. In this illustration, a Source device may be enabled 802, where the Source device may include an MHL compatible mobile device. Upon the connection of a cable between the Source and a Sink device 804, the Sink may operate to discover the connection with the Source 806, resulting in the Sink enabling a termination resistance 808. In addition, the Source may discover the connection with the Sink 810.

In some embodiments, a Source termination monitoring period for reference sensing of the Sink termination resistance may become valid 812, and, with the connection of the Source and Sink and the enablement of the Sink termination resistance, the Source RSEN value is True 814. If there is a disconnection of the cable 816, then the Sink termination resistance is no longer sensed 818, resulting in the RSEN value becoming False 820. In some embodiments, the RSEN value of False results in the Source discovery of the Sink Device being disabled and the disabling or floating of the Source termination resistance (pullup device) 822. In some embodiments, the monitoring of termination value thus becomes Not Valid 824. The Sink's discovery of the Source device may then be disabled 826, following by the disabling of the Sink's termination resistance 828.

Figure 9:
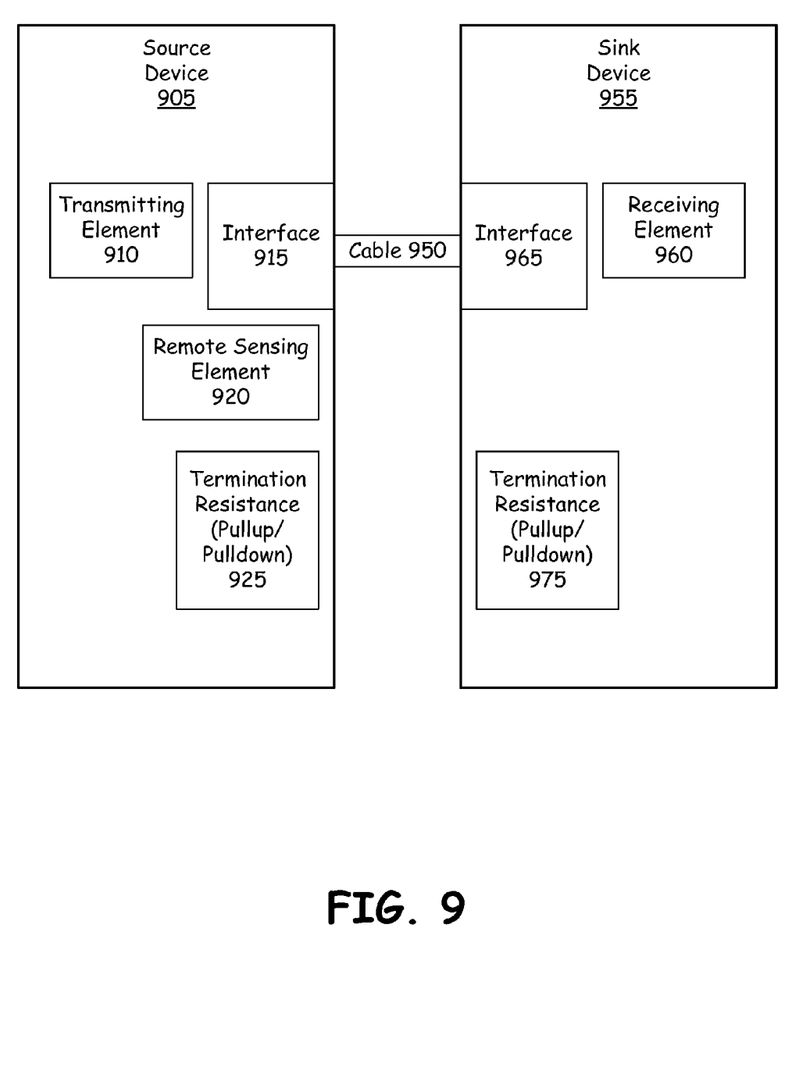
FIG. 9 is an illustration of an embodiment of a Source device to detect loss of connectivity with a Sink device.

FIG. 9 is an illustration of an embodiment of a Source device to detect loss of connectivity with a Sink device. In this illustration, a Source device 905 may become connected to a Sink Device 955 via a cable 950. The Source device 905 may include a transmitting element 910 for the transmission of data from the Source device 905 to the Sink device 955 and an interface 915 for the cable connection. Further, the Sink device 955 may include a receiving element 960 for the reception of data at the Sink device 955 from the Source device 905 and an interface 965 for the cable connection. The Source device 905 may include a switchable termination resistance (pullup or pulldown device) 925 that may be connected to a control bus of the cable connection 950. Further, the Sink device 955 may include a switchable termination resistance (pullup or pulldown device) 975 that may be connected to a control bus of the cable connection 950.

In some embodiments, the Source device 905 may further include a reference-sensing (RSEN) element 920 for the sensing of the Sink's termination resistance 975 via an electrical measurement, such as a measurement of voltage or current. In some embodiments, the RSEN is a component or device that is operable to detect the presence of the Sink's termination resistance 975 by passive or active means. In some embodiments, the Source device 905 is operable to determine the disconnection of the cable 950 between the Source 905 and the Sink 955 based on the lack of detection of the Sink's termination resistance by the RSEN element 920.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described. The illustrated elements or components may also be arranged in different arrangements or orders, including the reordering of any fields or the modification of field sizes.

The present invention may include various processes. The processes of the present invention may be performed by hardware components or may be embodied in computer-readable instructions, which may be used to cause a general purpose or special purpose processor or logic circuits programmed with the instructions to perform the processes. Alternatively, the processes may be performed by a combination of hardware and software.

Portions of the present invention may be provided as a computer program product, which may include a computer-readable medium having stored thereon computer program instructions for execution by one or more processors, which may be used to program a computer (or other electronic devices) to perform a process according to the present invention. The computer-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other type of media/computer-readable medium suitable for storing electronic instructions. Moreover, the present invention may also be downloaded as a computer program product, wherein the program may be transferred from a remote computer to a requesting computer.

Many of the methods are described in their most basic form, but processes may be added to or deleted from any of the methods and information may be added or subtracted from any of the described messages without departing from the basic scope of the present invention. It will be apparent to those skilled in the art that many further modifications and adaptations may be made. The particular embodiments are not provided to limit the invention but to illustrate it.

If it is said that an element "A" is coupled to or with element "B," element A may be directly coupled to element B or be indirectly coupled through, for example, element C. When the specification states that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification refers to "a" or "an" element, this does not mean there is only one of the described elements.

An embodiment is an implementation or example of the invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects.

What is claimed is:

1. A method comprising:
    discovering a connection of a source device with a sink device via an interface between the source device and the sink device, the interface comprising a control bus between the source device and the sink device;
    asserting a connection status signal responsive to discovering the connection;
    performing, by the source device, an electrical measurement of the interface between the source device and the sink device, wherein performing the electrical measurement includes sensing by the source device a presence or absence of a termination resistance of the sink device coupled to the source device via the interface, and wherein the electrical measurement is a measurement to determine the existence of the termination resistance of the sink device and includes sensing whether the termination resistance of the sink device is coupled with the control bus;
    if the sensing by the source device fails to detect the termination resistance of the sink device when connection status signal is asserted, determining by the source device that the connection with the sink device has been lost;
    responsive to determining by the source device that the connection with the sink device has been lost, disabling a connection of a termination resistance of the source device from the interface; and
    re-enabling the connection of the termination resistance of the source device to the interface after a time period,
    wherein the termination resistance of the sink device is not coupled with the control bus until a process of the sink device for discovering the connection of the source device to the sink device is completed.

2. The method of claim 1, wherein the source device is a data source device and the sink device is a data sink device.

3. The method of claim 1, wherein the discovering the connection status includes waiting a certain time period during which a change in the electrical measurement indicates a loss in physical connection, a status of the electrical measurement being ignored until the connection status signal is asserted.

4. The method of claim 3, further comprising changing the connection status signal to an unasserted state after determining that the connection with the sink device has been lost.

5. The method of claim 1, wherein discovering the connection of the source device with the sink device includes discovering the connection pursuant to an interface protocol.

6. The method of claim 5, wherein the interface protocol is HDMI™ (High-Definition Multimedia Interface) protocol or MHL™ (Mobile High-Definition Link) protocol.

7. An apparatus comprising:
    an interface for a connection with a sink apparatus, wherein the apparatus is operable to discover the connection to the sink apparatus and assert a connection status signal responsive to discovering the connection, wherein the interface comprises a control bus between the apparatus and the sink apparatus;
    a reference-sensing element to perform an electrical measurement on the interface with the sink apparatus to detect a presence or absence of a termination resistance of the sink apparatus coupled to the interface, wherein the electrical measurement is a measurement to determine the existence of the termination resistance of the sink apparatus and includes sensing whether the termination resistance of the sink apparatus is coupled with the control bus;
    wherein the apparatus is to determine that connectivity with the sink apparatus is lost when the reference-sensing element fails to detect the termination resistance of the sink apparatus when the connection status signal is asserted;
    wherein the apparatus is to disable a connection of a termination resistance of the apparatus from the interface responsive to determining that the connectivity with the sink apparatus is lost;
    wherein the apparatus is to re-enable the connection of the termination resistance of the apparatus to the interface after a time period; and
    wherein the termination resistance of the sink apparatus is not coupled with the control bus until a process of the sink apparatus for discovering the connection of the apparatus to the sink apparatus is completed.

8. The apparatus of claim 7, wherein the electrical measurement is a measurement of a voltage or current on the interface.

9. The apparatus of claim 7, where the interface comprises a pair of differential nodes.

10. The apparatus of claim 7, wherein the apparatus is a source apparatus providing audio/video data to the sink apparatus.

11. The apparatus of claim 10, wherein the apparatus is an HDMI™ (High-Definition Multimedia Interface) or MHL™ (Mobile High-Definition Link) compatible apparatus.

12. The apparatus of claim 7, wherein the reference-sensing element provides a passive measurement that does not force a voltage or current on the interface between the apparatus and the sink apparatus.

13. The apparatus of claim 7, wherein the reference-sensing element provides an active measurement forcing a fixed amount of voltage or current on the interface between the apparatus and the sink apparatus.

14. A non-transitory computer-readable medium having stored thereon data representing sequences of instructions that, when executed by a processor, cause the processor to perform operations comprising:
    discovering a connection of a source device with a sink device via an interface between the source device and the sink device, the source device to provide data to the sink device via the connection, wherein the interface comprises a control bus between the source device and the sink device;
    asserting a connection status signal responsive to discovering the connection;
    enabling a sensing element of the source device to detect a presence or absence of a termination resistance of the sink device via an electrical measurement of the interface between the source device and the sink device, wherein the electrical measurement is a measurement to determine the existence of the termination resistance of the sink device and includes sensing whether the termination resistance of the sink device is coupled with the control bus;

upon failing to detect the termination resistance on the interface when the connection status signal is asserted, determining by the source device that the connection with the sink device has been lost;

responsive to determining by the source device that the connection with the sink device has been lost, disabling a connection of a termination resistance of the source device from the interface; and re-enabling the connection of the termination resistance of the source device to the interface after a time period, wherein the termination resistance of the sink device is not coupled with the control bus until a process of the sink device for discovering the connection of the source device to the sink device is completed.

15. The medium of claim 14, wherein the discovery of the connection between the source device and the sink device utilizes HDMI™ (High-Definition Multimedia Interface) protocol or MHL™ (Mobile High-Definition Link) protocol.

\* \* \* \* \*